US008830205B2

(12) United States Patent
Chang et al.

(10) Patent No.: US 8,830,205 B2
(45) Date of Patent: Sep. 9, 2014

(54) CAPACITIVE TOUCH SCREEN WITH SQUARE OR RHOMBUS CONDUCTIVE STRIPS WITH EXTENSION PADS

(75) Inventors: Chin-Fu Chang, Taipei (TW); Cheng-Han Lee, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 19 days.

(21) Appl. No.: 13/606,482

(22) Filed: Sep. 7, 2012

(65) Prior Publication Data

US 2012/0327027 A1 Dec. 27, 2012

Related U.S. Application Data

(63) Continuation-in-part of application No. 12/923,810, filed on Oct. 8, 2010, now Pat. No. 8,643,613, which is a continuation-in-part of application No. 13/211,591, filed on Aug. 17, 2011, now Pat. No. 8,502,794, and a continuation-in-part of application No. 13/305,366, filed on Nov. 28, 2011, now Pat. No. 8,614,688.

(60) Provisional application No. 61/250,051, filed on Oct. 9, 2009, provisional application No. 61/298,243, filed on Jan. 26, 2010, provisional application No. 61/298,252, filed on Jan. 26, 2010, provisional application No. 61/428,499, filed on Dec. 30, 2010, provisional application No. 61/435,568, filed on Jan. 24, 2011, provisional application No. 61/472,971, filed on Apr. 7, 2011.

(51) Int. Cl.
G06F 3/045 (2006.01)
G06F 3/041 (2006.01)
G06F 3/044 (2006.01)
G01R 27/26 (2006.01)
G06F 3/047 (2006.01)

(52) U.S. Cl.
CPC .. *G01R 27/2605* (2013.01); *G06F 2203/04104* (2013.01); *G06F 3/047* (2013.01); *G03F 3/0418* (2013.01); *G06F 3/0416* (2013.01); *G06F 2203/04111* (2013.01); *G06F 3/044* (2013.01); *G06F 2203/04103* (2013.01)
USPC .......................................................... 345/174

(58) Field of Classification Search
USPC ................... 345/173–178; 178/18.01–19.03; 29/846; 216/13; 438/100; 427/58, 216; 257/40–41
See application file for complete search history.

(56) References Cited

U.S. PATENT DOCUMENTS

2008/0309633 A1* 12/2008 Hotelling et al. ............. 345/173
2010/0001973 A1*  1/2010 Hotelling et al. ............. 345/174
2011/0084930 A1*  4/2011 Chang et al. .................. 345/173
2012/0019450 A1*  1/2012 Huang et al. .................. 345/173

* cited by examiner

*Primary Examiner* — Liliana Cerullo
(74) *Attorney, Agent, or Firm* — WPAT, PC; Justin King

(57) ABSTRACT

The present invention provides a mutual capacitive multi-touch screen. The conductive strip pattern allows that, when a touch range of each external conductive object on the mutual capacitive multi-touch screen is larger than a predetermined condition, capacitive coupling between each external conductive object and first conductive strip is greater than capacitive coupling between each external conductive object and second conductive strip, such that the proportion of a driving signal flowing out of the first conductive strip via at least one first external conductive object in the external conductive objects and into the second conductive strip via at least one second external conductive object in the external conductive objects decreases as the number of second external conductive objects increases.

23 Claims, 9 Drawing Sheets

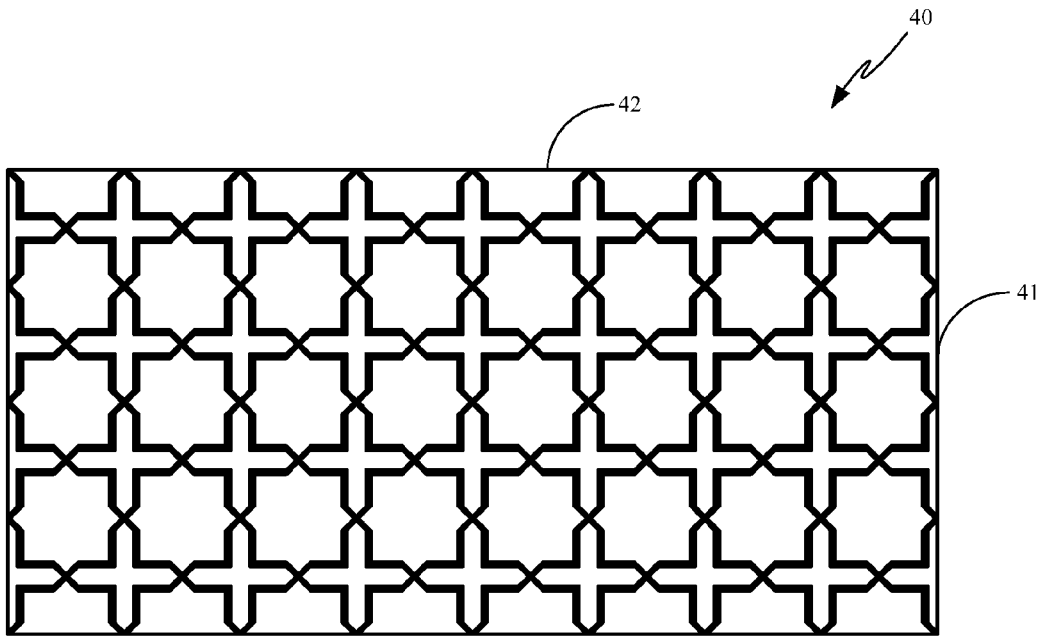

FIG. 4

A Capacitive touch screen is provided, which is in the shape of a rectangle with two opposing long sides and two opposing short sides.
510

At least one first conductive strip is provided with the driving signal from one of the long sides, and the mutual capacitive coupling signals are received from the second conDuctive strips at one of the short sides when the at least one first conductive strip is being provided with the driving signal.
520

FIG. 5

CAPACITIVE TOUCH SCREEN WITH SQUARE OR RHOMBUS CONDUCTIVE STRIPS WITH EXTENSION PADS

CROSS REFERENCE TO RELATED APPLICATIONS

This application claims the benefit of U.S. application Ser. No. 12/923,810, filed on Oct. 8, 2010, U.S. application Ser. No. 13/211,591, filed on Aug. 17, 2011 and U.S. application Ser. No. 13/305,366, filed on Nov. 28, 2011, which are herein incorporated by reference for all intents and purposes. This application claims the benefit of U.S. Provisional Application No. 61/250,051 filed on Oct. 9, 2009, U.S. Provisional Application No. 61/298,243 filed on Jan. 26, 2010, U.S. Provisional Application No. 61/298,252 filed on Jan. 26, 2010, U.S. Provisional Application No. 61/428,499 filed on Dec. 30, 2010, U.S. Provisional Application No. 61/435,568 filed on Jan. 24, 2011 and U.S. Provisional Application No. 61/472,971 filed on Apr. 7, 2011.

BACKGROUND OF THE INVENTION

1. Field of the Invention

The present invention relates to capacitive touch screen, and more particularly, to a capacitive touch screen that reduces the effect of negative touches.

2. Description of the Prior Art

Referring to FIG. 1A, when a driving signal D is passing through a driven conductive strip, a signal I may flow from a first finger A to another finger B of the same hand, such that during scanning of sensing information SI, signal variations in mutual-capacitive coupling will be sensed on conductive strips corresponding to fingers A and B, such as touch-related sensing information SA and SB as shown, respectively. It can be seen from FIG. 1A that the directions in which the touch-related sensing information SA and SB vary are opposite to each other, that is, the signals are opposite to each other.

The touch-related sensing information SA represents the variations in capacitive coupling at an intersecting region between a sensed conductive strip corresponding to the location of the first finger A and a driven conductive strip. In this case, a real touch exists. Similarly, the touch-related sensing information SB represents the variations in capacitive coupling at an intersecting region between a sensed conductive strip corresponding to the location of the second finger B and a driven conductive strip. However, the intersecting region represented by the touch-related sensing information SB is actually not touched, thus resulting in a so-called "negative (unreal) touch", i.e. a "phantom touch". In the following descriptions, a signal flowing out of a conductive strip due to the capacitive coupling of the first finger A is called a real-touch signal, while a signal flowing out of a conductive strip due to the capacitive coupling of the second finger B is called a negative-touch signal. Thus, the variations in capacitive couplings corresponding to the real-touch and negative-touch signals detected on the conductive strips are real touch-related sensing information and negative touch-related sensing information, respectively.

Referring to FIG. 1B, when the first finger A and the second finger B are on the same or nearby sensed conductive strip(s), the corresponding touch-related sensing information SA and SB will cancel each other as the signals are opposite to each other, thus reducing the signal. When the magnitudes of the touch-related sensing information SA and SB are close to each other, the resulting signal may be too small to be determined as a real touch. In the following descriptions, the situation in which the variations in the detected capacitive coupling of the real touch are distorted due to the fact that the negative and real touches are in proximity to each other is called a "negative-touch effect".

In the above example, the first finger A and the second finger B are capacitively coupled to the conductive strips via an insulating surface layer. The thinner the insulating surface layer, the greater the negative-touch effect. In other words, the greater the distortion of the variation in the detected capacitive coupling of the real touch. Furthermore, the more negative touches caused by the second finger B, the larger the total number of negative-touch signals, and the greater the distortion of the variation in the detected capacitive coupling of the real touch, even to the extent that an original real touch-related sensing information is regarded as a negative touch-related sensing information. In other words, in the worst-case scenario in which all the signals from the second finger B and the signal from the first finger A are on the same detected conductive strip, the negative-touch effect is greatest at this time. Needless to say, in mutual-capacitive coupling, tolerance to the negative-touch effect determines if the location of a real touch can be correctly detected and the number of locations of real touches that can be detected at the same time.

The problem of negative-touch effect is more severe in portable devices. This is because the ground that is in contact with a portable device is different from the ground that is in contact with a human body. In order to meet market demands, thinner portable devices are desired, and as a result of this, the capacitive touch screen is also made thinner. The capacitive touch screens are usually arranged above the display, so noise coming from the display constantly interferes with the capacitive touch screen. In order to reduce interference, the most direct way is to add a rear shielding layer to the back of the capacitive touch screen (the portion nearer to the display), which connects to a ground potential to eliminate noise coming from the display. However, the addition of the rear shielding layer inevitably increases the thickness of the capacitive touch screen, and which does not meet the requirements of the markets.

Another approach that does not require the addition of a rear shielding layer while reducing the interference of the noise from the display is to arrange conductive strips that will be provided with the driving signal (driven conductive strips) on a lower layer, and sensed conductive strips on an upper layer in a double ITO (DITO) structure, wherein the driven conductive strips cover most of the display. Except for the conductive strip that is being provided with the driving signal, all the other strips are coupled to ground, thus creating an effect similar to a rear shielding layer. Since the sensed conductive strips are on the upper layer, in order to reduce the negative-touch effect, the thickness of the insulating surface layer thus cannot be effectively made thinner. When the insulating surface layer is made of a glass material, the distance between a sensed conductive strip and a finger tip needs to be kept at about 1.1 mm or more. Even if a plastic material is adhered to support the glass, the distance between a sensed conductive strip and a finger tip needs to be kept at about 0.7 mm or more. With such strict restrictions to the thickness of the insulating surface layer, the remaining solution is to reduce the thickness of an insulating intermediate layer between the driven conductive strips and the sensed conductive strips.

Compared to a DITO structure, the thickness of the insulating surface layer in a single ITO (SITO) structure also faces the same limitation. However, there is no insulating intermediate layer, so the overall thickness is much smaller than the DITO structure, but the rear shielding effect similar to the one discussed above is also lost. If noise interference cannot be effectively eliminated, then it is better to arrange the SITO structure inside the display (in cell). If it is arranged above the display, then the provision of a rear shielding layer may become a necessity.

Noise interference arising from the display hinders the ability to correctly determine the location of a real touch, while the negative-touch effect affects the ability to correctly determine the locations of multiple real touches. Obviously, in order to reduce the thickness of the capacitive touch screens, one needs to consider the distance between the sensed conductive strips and the finger tip, and moreover, how to eliminate the noise interference coming from the display.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

When mutual capacitive multi-touch detection is performed on a mutual-capacitive multi-touch screen, the driving signal may flow from a first finger to a second finger of the same palm by capacitive coupling, which may reduce the signal or signal variation indicating the location of a real touch, causing misjudgment of the real touch. One objective of the present invention is thus to reduce the negative-touch effect flowing between the fingers.

When mutual capacitive multi-touch detection is performed on a mutual-capacitive multi-touch screen, capacitive coupling of signals flowing between multiple external conductive objects and into the multi-touch screen may severely distort the variations in detected capacitive coupling of a real touch. In order to avoid this problem, the thickness of an insulating surface layer cannot effectively be made thinner.

Thus, the objective of the present invention is to reduce the proportion of the driving signal flowing into a detected conductive strip again from a conductive strip by capacitive coupling of external conductive objects through the insulating surface layer. This is achieved by providing a conductive strip pattern, which allows capacitive coupling between a driven conductive strip and an external conductive object to be greater than capacitive coupling between a detected conductive strip and the external conductive object. Thereby, negative touch effect is reduced, and this in turn reduces the thickness of the insulating surface layer.

In addition, capacitive coupling signals of the detected conductive strips are represented by differential values or dual differential values. This effectively reduces noise interferences coming from the rear display, eliminating the need for a rear shielding layer, and reducing the thickness of the mutual capacitive multi-touch screen. In the case where capacitive coupling signals of the detected conductive strips are represented by dual differential values, signal distortions due to deformations can also be reduced.

In a mutual capacitive multi-touch screen proposed by the present invention, the conductive strip pattern allows that the exposed area of the guarding pattern covered by a touch range of a valid touch for which a correct position can be detected to be larger than the exposed area of the detected conductive strips or larger than the exposed area of the conductive strip pattern, or the exposed areas of the guarding pattern and the driven conductive strips covered by the touch range is larger than the area of the detected conductive strips covered by the touch range, and capacitive coupling between a driven conductive strip and an external conductive object is greater than capacitive coupling between a detected conductive strip and the external conductive object. Therefore, when the driving signal flows into a conductive strip from a conductive strip by capacitive coupling of external conductive objects through the insulating surface layer, the influence of the signal flowing into the detected conductive strip on the position detection is reduced.

In another mutual capacitive multi-touch screen proposed by the present invention, capacitive coupling between a driven conductive strip and an external conductive object is made to be greater than capacitive coupling between a detected conductive strip and the external conductive object by making the distance between the driven conductive strip and the external conductive object to be larger than the distance between the detected conductive strip and the external conductive object. Therefore, when the driving signal flows into a conductive strip from a conductive strip by capacitive coupling of external conductive objects through the insulating surface layer, the influence of the signal flowing into the detected conductive strip on the position detection is reduced.

Obviously, in the mutual capacitive multi-touch screens, compared to the detected conductive strips, the driven conductive strips may be both closer to the external conductive object and have a larger exposed area.

The objectives of the present invention can be achieved by the following technical schemes. A detection method for a capacitive touch screen proposed by the present invention includes: providing a capacitive touch screen in the shape of a rectangle with two opposing long sides and two opposing short sides, the capacitive touch screen including: a plurality of first conductive strips being operatively provided with a driving signal during mutual capacitive coupling detection, wherein each first conductive strip is composed of a plurality of first connecting lines connected in series with a plurality of first conductive pads, and each first conductive strip is a square or a rhombus with an extension pad extending from each of the four sides, wherein the first conductive strips are in parallel with the short sides; and a plurality of second conductive strips providing mutual capacitive coupling signals, wherein each second conductive strip is composed of a plurality of second connecting lines connected in series with a plurality of second conductive pads, and each second conductive strip is a square or a rhombus with an indented recess space on each of the four sides, wherein the second conductive strips are in parallel with the long sides; and providing at least one of the first conductive strips with the driving signal from one of the long sides, and receiving the mutual capacitive coupling signals from the second conductive strips at one of the short sides when the at least one first conductive strip is being provided with the driving signal.

The objectives of the present invention can also be achieved by the following technical schemes. A device including capacitive touch screen for detecting touches or approaches of external conductive objects proposed by the present invention includes: the capacitive touch screen which includes: a plurality of first conductive strips being operatively provided with a driving signal during mutual capacitive coupling detection, wherein each first conductive strip is composed of a plurality of first connecting lines connected in series with a plurality of first conductive pads, and each first conductive strip is a square or a rhombus with an extension pad extending from each of the four sides; and a plurality of second conductive strips providing mutual capacitive coupling signals, wherein each second conductive strip is composed of a plurality of second connecting lines connected in series with a plurality of second conductive pads, and each second conductive strip is a square or a rhombus with an indented recess space on each of the four sides; and a controller providing the driving signal and receiving the mutual capacitive coupling signals from the second conductive strips when the at least one first conductive strip is being provided with the driving signal, wherein the first conductive strips and the second conductive strips are exposed and separated from each other, and one of the extension pads is situated in each recess space.

The objectives of the present invention can also be achieved by the following technical schemes. A capacitive touch screen for detecting touches or approaches of external conductive objects proposed by the present invention includes: a plurality of first conductive strips being operatively provided with a driving signal during mutual capacitive coupling detection, wherein each first conductive strip is composed of a plurality of first connecting lines connected in series with a plurality of first conductive pads, and each first conductive strip is a square or a rhombus with an extension pad extending from each of the four sides; and a plurality of second conductive strips providing mutual capacitive coupling signals, wherein each second conductive strip is composed of a plurality of second connecting lines connected in series with a plurality of second conductive pads, and each second conductive strip is a square or a rhombus with an indented recess space on each of the four sides, wherein the first conductive strips and the second conductive strips are exposed and separated from each other, and one of the extension pads is situated in each recess space.

Compared to the prior art in which the negative-touch effect increases as the number of external conductive objects which facilitates flowing of signals out of conductive strips increases, in the disclosed technical schemes of present invention, the negative-touch effect decreases as the number of external conductive objects which facilitates flowing of signals out of conductive strips increases, which is contrary to the prior art. This means a higher tolerance to the negative-touch effect, and the thickness of the insulating surface layer can be made thinner.

BRIEF DESCRIPTION OF THE DRAWINGS

The present invention can be more fully understood by reading the following detailed description of the preferred embodiments, with reference made to the accompanying drawings, wherein:

FIG. 4 is a schematic diagram depicting a capacitive touch screen; and

FIG. 5 is a flowchart illustrating a detection method for a capacitive touch screen.

DETAILED DESCRIPTION OF THE PREFERRED EMBODIMENTS

Figure 1A:
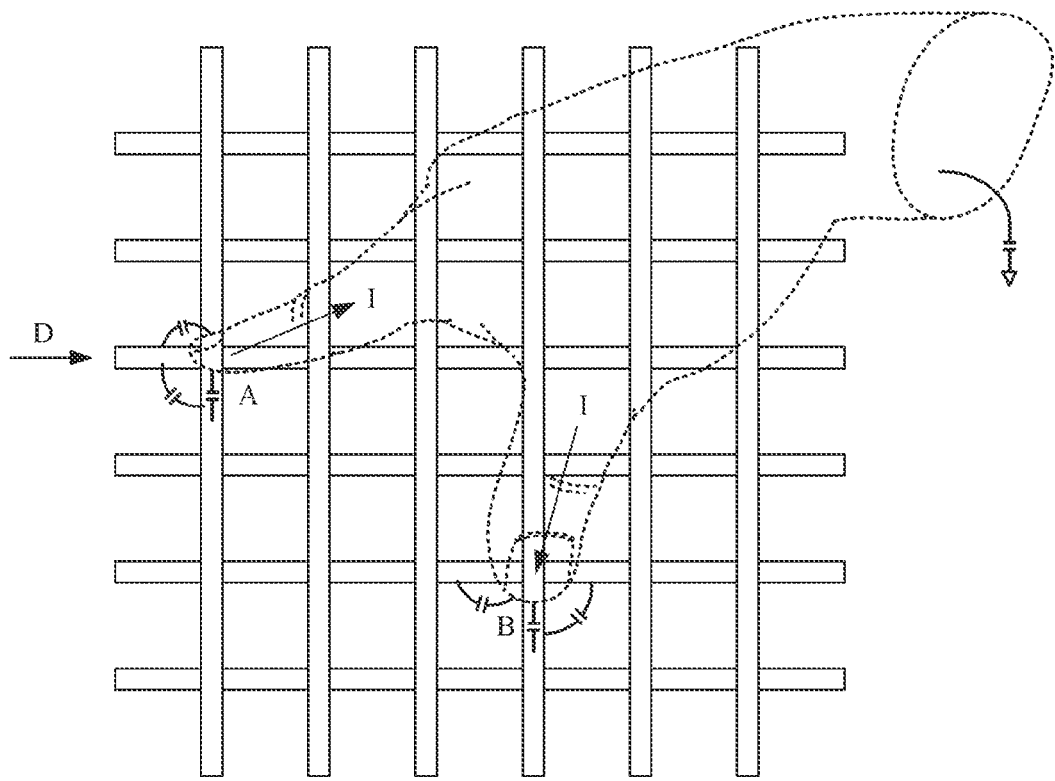
FIGS. 1A and 1B are schematic diagrams depicting the negative-touch effect in the prior art.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Figure 1B:
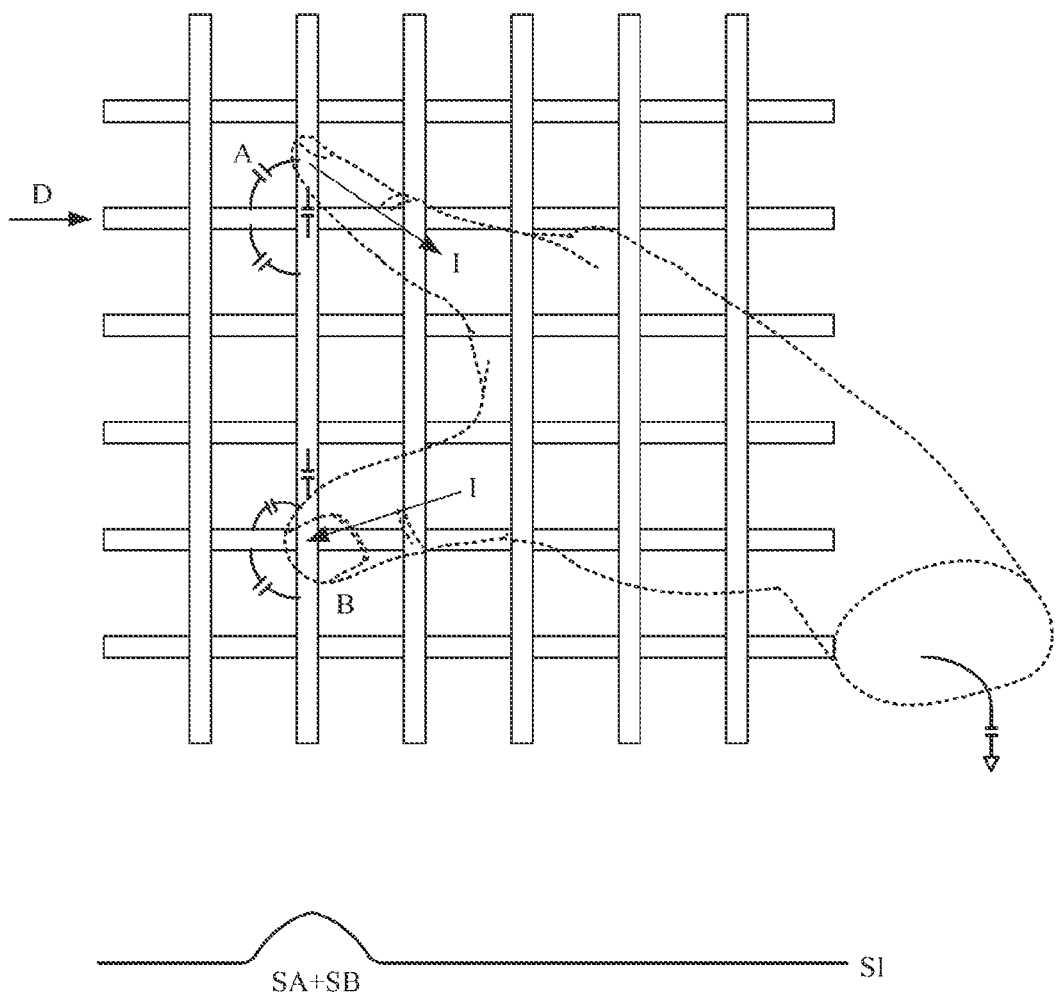
Figure 1C:
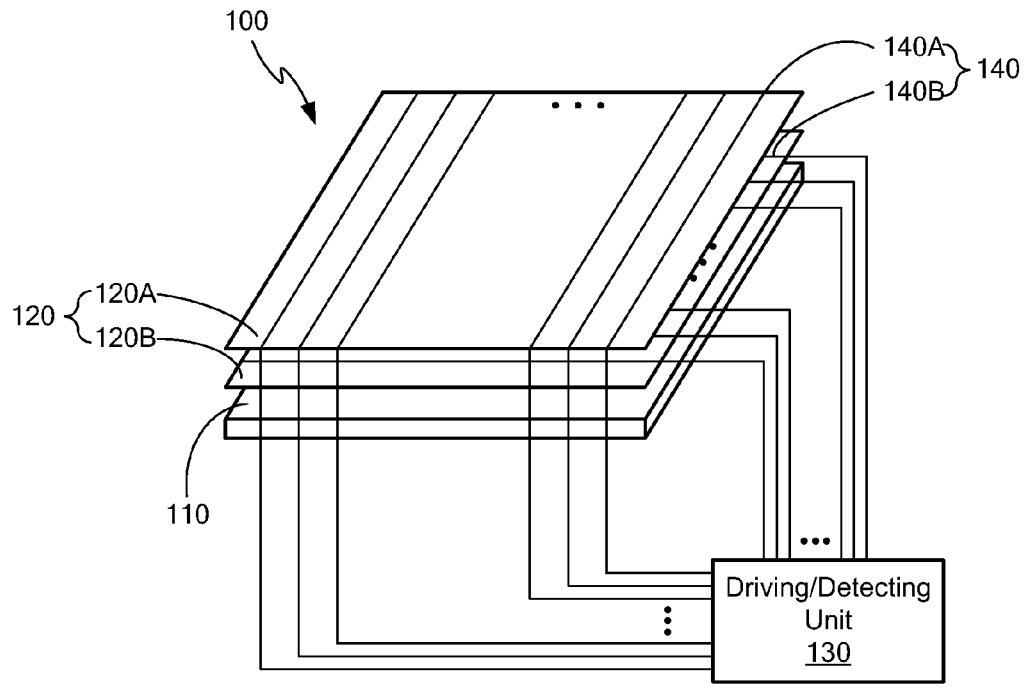
FIGS. 1C and 1D are schematic diagrams depicting a position detecting system.
Figure 1D:
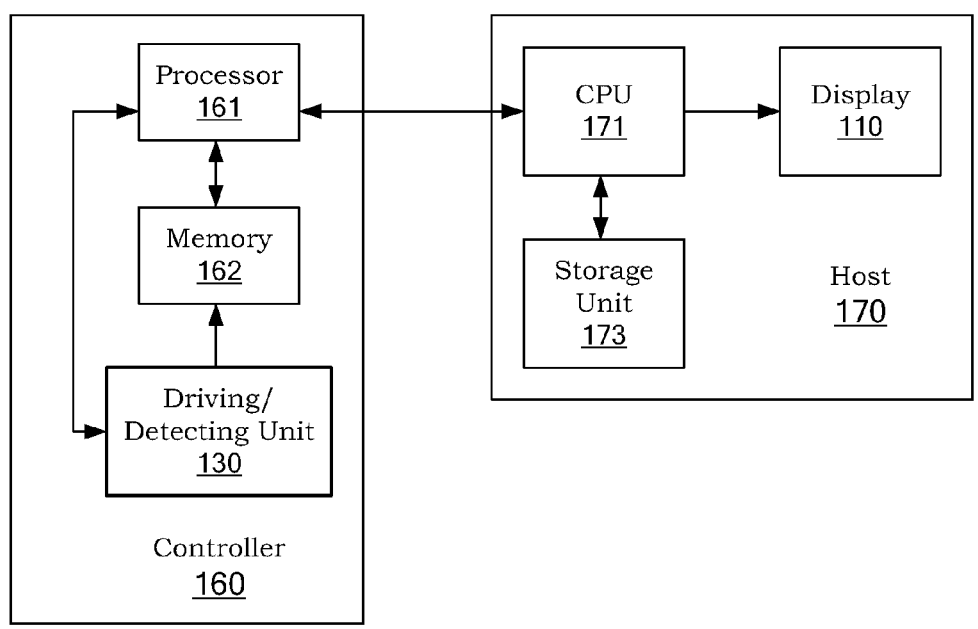

Referring to FIG. 1C, the present invention provides a position detecting device 100, which includes a sensing device 120 and a driving/detecting unit 130. The sensing device 120 has a sensing layer. In an example of the present invention, the sensing layer can include a first sensing layer 120A and a second sensing layer 120B. The first and second sensing layers 120A and 120B each has a plurality of conductive strips 140, wherein the first conductive strips 140A of the first sensing layer 120A and the second conductive strips 140B of the second sensing layer 120B intersect with each other. In another example of the present invention, the first and second conductive strips 140A and 140B are disposed on a co-planar sensing layer. The driving/detecting unit 130 produces sensing information based on signals of the conductive strips 140. In the case of self-capacitive detection, for example, conductive strips 140 that are being driven are detected. In the case of mutual-capacitive detection, conductive strips 140 that are not being driven by the driving/detecting unit 130 are detected. In addition, the sensing device 120 can be disposed on top of a display 110. An optional rear shielding layer (not shown) can be interposed between the sensing device 120 and the display 110. In a preferred example of the present invention, there is no rear shielding layer between the sensing device 120 and the display 110 so as to reduce the thickness of the sensing device 120.

The first and second conductive strips can be a plurality of column conductive strips and row conductive strips arranged in columns and rows; a plurality of first dimensional conductive strips and second dimensional conductive strips arranged in first and second dimensions; or a plurality of first axial conductive strips and second axial conductive strips arranged in first and second axes. In addition, the first and second conductive strips can be arranged in orthogonal or non-orthogonal directions. For example, in a polar coordinate system, one of the first and second conductive strips can be arranged in radial direction, and the other one of the first and second conductive strips can be arranged in circular direction. Furthermore, one of the first and second conductive strips can be driving conductive strips, while the other one of the first and second conductive strips can be detecting conductive strips. Said "first dimension" and "second dimension", "first axis" and "second axis", "driving" and "detecting", "driven" or "detected" conductive strips can be used to mean said "first" and "second" conductive strips, including but not limited to, being arranged in orthogonal grids, and in any other geometric configurations comprising first dimensional and second dimensional intersecting conductive strips.

Figure 1E:
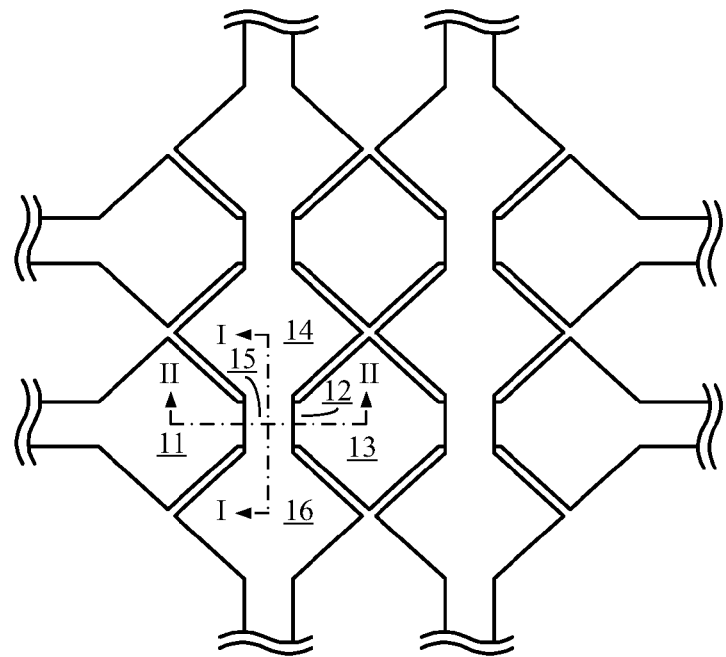
FIGS. 1E to 1H are schematic diagrams depicting a sensing layer.
Figure 1F:
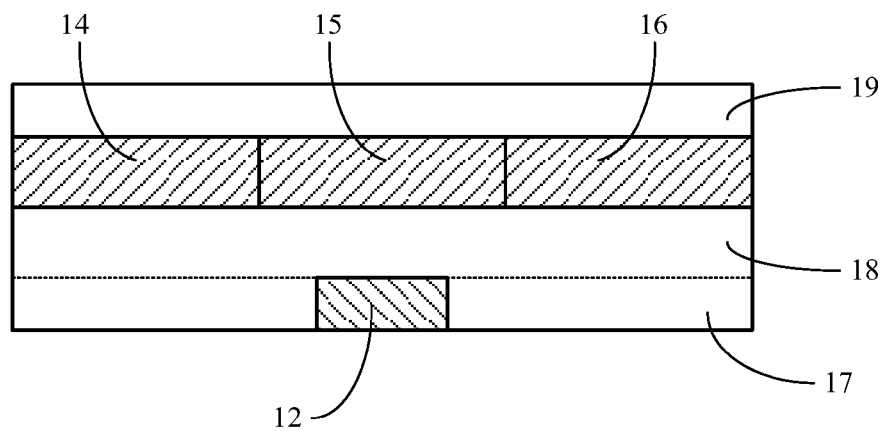
Figure 1G:
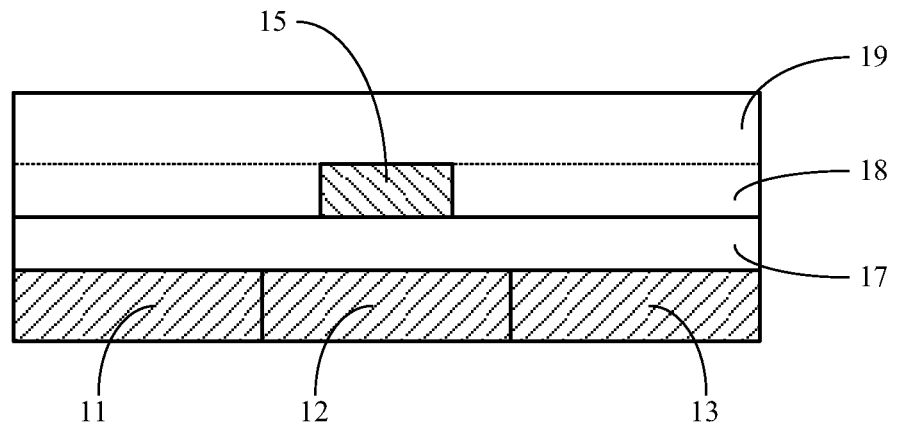

The position detecting device 100 of the present invention can be applied to a computing system as shown in FIG. 1G, which includes a controller 160 and a host 170. The controller includes the driving/detecting unit 130 to operatively couple the sensing device 120 (not shown). In addition, the controller 160 can include a processor 161 for controlling the driving/detecting unit 130 in generating the sensing information. The sensing information can be stored in a memory 162 and accessible by the processor 161. Moreover, the host 170 constitutes the main body of the computing system, and mainly includes a central processing unit 171, a storage unit 173 that can be accessed by the central processing unit 171, and the display 110 for displaying results of operations.

In another example of the present invention, there is a transmission interface between the controller 160 and the host 170. The controlling unit transmits data to the host via the transmission interface. One with ordinary skill in the art can appreciate that the transmission interface may include, but not limited to, UART, USB, I2C, Bluetooth, Wi-Fi, IR and other wireless or wired transmission interfaces. In an example of the present invention, data transmitted can be positions (e.g. coordinates), identified results (e.g. gesture codes), commands, sensing information or other information provided by the controller 160.

In an example of the present invention, the sensing information can be initial sensing information generated under the control of the processor 161, and this information is passed onto the host 170 for position analysis, such as position analysis, gesture determination, command identification, and so on. In another example of the present invention, the sensing information can be analyzed by processor 161 first before forwarding the determined positions, gestures, commands, or the like to the host 170. The present invention does not limit to this example, and one with ordinary skill in the art can readily recognize other interactions between the controller 160 and the host 170.

At each intersection of the conductive strips, the upper and lower conductive strips form the positive and negative electrodes. Each intersection can be regarded as one pixel in an image. When one or more external conductive objects approach or touch the sensing device, said image can be regarded as a photographed touch image (e.g. the pattern of a finger upon touching the sensing device).

When a driven conductive strip is being provided with a driving signal, the driven conductive strip itself produces self capacitance, and produces mutual capacitance on each intersection of the driven conductive strip. Said self-capacitive detection is detecting the self-capacitance of all the conductive strips, which is particularly useful in determining approach or touch of a single external conductive object.

In said mutual-capacitive detection, when a driven conductive strip is being provided with a driving signal, capacitances or changes in capacitances of all intersections on the driven conductive strip are detected with all sensed conductive strips arranged in different dimensions to the driven conductive strip, and are regarded as a row of pixels. Accordingly, all the rows of pixels are combined to form said image. When one or more external conductive objects approach or touch the sensing device, said image can be regarded as a photographed touch image, which is particularly useful in determining approaches or touches of a plurality of external conductive objects.

Referring to FIG. 1E, a pattern of a conventional capacitive touch screen is shown, which includes a plurality of conductive pads and a plurality of connecting lines. These connecting lines include a plurality of first connecting lines and a plurality of second connecting lines. These first connecting lines are arranged in a first direction (e.g. one of the horizontal and vertical directions) and are connected to a portion of these conductive pads to form a plurality of conductive strips arranged in the first direction. Similarly, these second connecting lines are arranged in a second direction (e.g. the other one of the horizontal and vertical directions) and are connected to another portion of these conductive pads to form a plurality of conductive strips arranged in the second direction.

These conductive strips (the first and second conductive strips) can be made of transparent or opaque materials, such as transparent Indium Tin Oxide (ITO). In terms of the structure, it can be categorized into a Single ITO (SITO) structure and a Double ITO (DITO) structure. One with ordinary skill in the art can appreciate that other materials can be used as the conductive strips, such as carbon nano tube, and they will not be further described.

In an example of the present invention, the vertical direction is regarded as the first direction, while the horizontal direction is regarded as the second direction. Thus, the vertical conductive strips are the first conductive strips, and the horizontal conductive strips are the second conductive strips. However, one with ordinary skill in the art can appreciate that the above is merely an example of the present invention, and the present invention is not limited to this. For example, the horizontal direction can be regarded as the first direction, while the vertical direction can be regarded as the second direction.

FIG. 1F is a cross-sectional diagram of FIG. 1E along a line I, which shows a substrate 17, a portion of a second conductive strip (including a conductive pad 11, a second connecting line 12, and a conductive pad 13), an insulating layer 18, a portion of a first conductive strip (including a first connecting line 15), and a surface layer 19. In an example of the present invention, the substrate 17, the insulating layer 18, and the surface layer 19 can be made of transparent or opaque materials, such as glass or a plastic film. One with ordinary skill in the art can recognize that other materials can be used for the elements described in this example, and they will not be further described.

In an example of the present invention, FIG. 1G is a cross-sectional diagram of FIG. 1E along a line II, illustrating the structure of a DITO capacitive touch screen. It includes a substrate 17, a portion of a second conductive strip (including a second connecting line 12), an insulating layer 18, a portion of a first conductive strip (including a conductive pad 14, a first connecting line 15, and a conductive pad 16), and a surface layer 19.

Figure 1H:
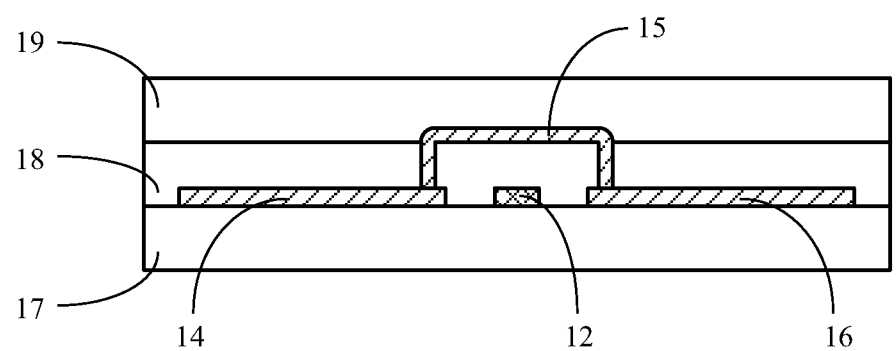

In an example of the present invention, FIG. 1H is a cross-sectional diagram of FIG. 1E along the line I, illustrating the structure of a SITO capacitive touch screen. It includes a substrate 17, a portion of a second conductive strip (including a second connecting line 12), an insulating layer 18, a portion of a first conductive strip (including a conductive pad 14, a first connecting line 15, and a conductive pad 16), and a surface layer 19. The conductive pads 14 and 15 of the first conductive strip and the second connecting line 12 of the second conductive strip are co-planar, and the first connecting line 15 bridges over the second connecting line 12. The first connecting line 15 is electrically isolated from the second connecting line 12 by the insulating layer 18. One with ordinary skill in the art can appreciate other types of bridging, for example, instead of the "over-bridge" structure as shown in the present example, an "under-bridge" structure can be formed.

Referring back to FIG. 1A, the touch-related sensing information SA represents the variation in mutual capacitive coupling between the first finger A, a driven conductive strip, and a sensed conductive strip, while the touch-related sensing information SB represents the variation in mutual capacitive coupling between the second finger B and a sensed conductive strip.

Since the first finger A and the second finger B of the same hand touch or approach a sensed conductive strip simultaneously, a real-touch signal may be diminished by an opposite signal flowing through the fingers, as shown in FIG. 1B. The most direct way for solving this problem is to reduce the signal flowing to the sensed conductive strip through the fingers based on the fact that the level of capacitive coupling $$C = \epsilon \frac{A}{d},$$

that is, the level of capacitive coupling C is proportional to the area A of capacitive coupling, and inversely proportional to the distance of capacitive coupling.

Since there is an insulating surface layer between the fingers and the sensed conductive strips, so one way to reduce the signal flowing to the sensed conductive strip through the fingers is to increase the thickness of the insulating surface layer. In a preferred example of the present invention, the insulating surface layer can be a surface glass with an appropriate thickness of 1.0 mm and above or 1.1 mm and above.

However, as thinner portable devices are being demanded, the thinner the surface glass the better it is. In an example of the present invention, the thickness of the insulating surface layer may be required to be less than 0.7 mm. In view of this, an alternative way of reducing the signal flowing to the sensed conductive strip through the fingers is to reduce the exposed area of the sensed conductive strip.

Figure 2A:
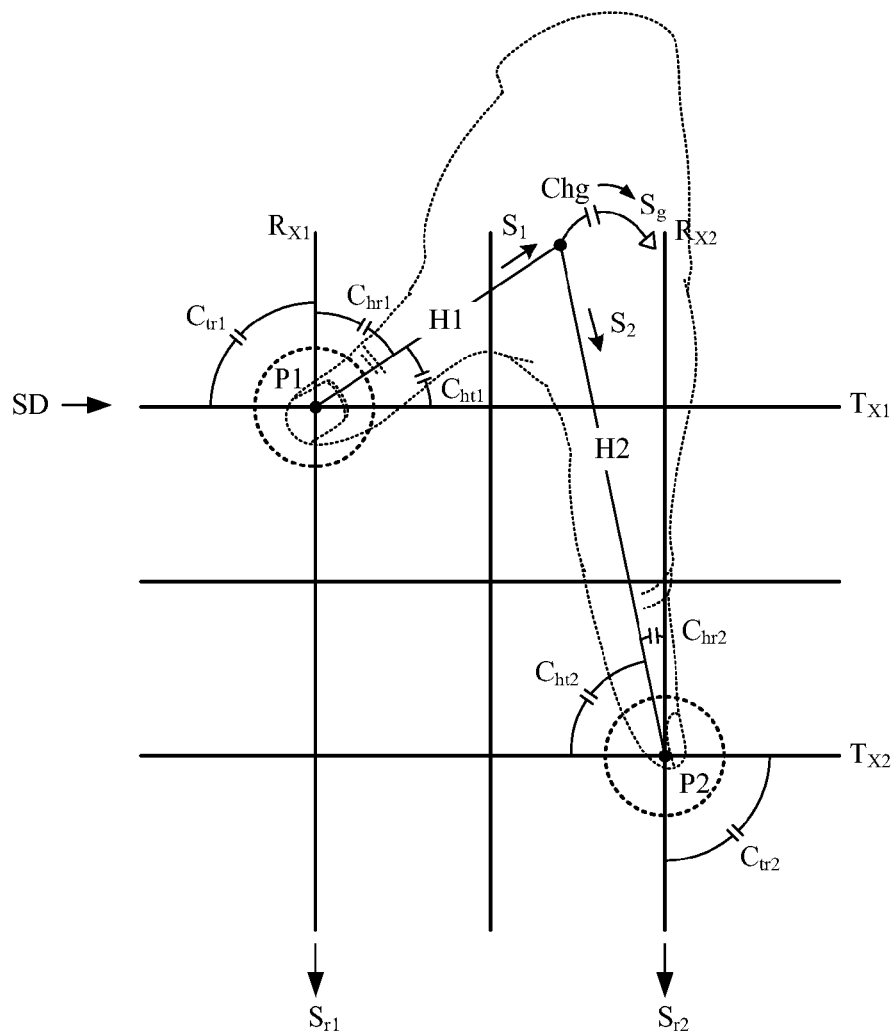
FIGS. 2A and 2B are schematic diagrams analyzing the negative-touch effect.

Referring to FIG. 2A, a first finger and a second finger of a human hand are touching a first touch zone P1 and a second touch zone P2, respectively. The first touch zone P1 covers the intersecting region of a first conductive strip Tx1 and a second conductive strip Rx1, and the second touch zone P2 covers the intersecting region of a first conductive strip Tx2 and a second conductive strip Rx2. When the first conductive strip Tx1 is provided with a driving signal SD, the rest of the first conductive strips including the first conductive strip Tx2 are provided with a DC signal, and each of the second conductive strips is detected individually. In an example of the present invention, those second conductive strips not yet detected can be provided with a DC signal. The DC signal can be provided by a ground circuit or a circuit that maintains a DC signal. Thus, in the present invention, coupling to a ground circuit or a DC circuit can be regarded as being provided with a DC signal, such as a circuit being grounded or a conductive strip being grounded. Similarly, coupling to a circuit that provides a driving signal can be regarded as being provided with a driving signal, for example, a circuit being driven or a conductive strip being driven. Furthermore, the driving signal SD can be provided to a plurality of first conductive strips simultaneously. In a preferred example of the present invention, the plurality of first conductive strips can be a plurality of conductive strips adjacent to one another, for example, two or three adjacent conductive strips. With a portion of the conductive strips being simultaneous driven, signals detected by the detected conductive strips can be adaptively controlled (increased), and the effect of moisture or conductive particles attached on the insulating surface layer during self-capacitive detection can be reduced.

In this diagram, when the driving signal SD is provided to the first conductive strip Tx1, the finger that is touching the first touch zone P1 is a real touch, and when the driving signal SD is provided to the first conductive strip Tx2, the finger that is touching the second touch zone P2 is a real touch. Similarly, the finger that causes an negative touch will be different according to which first conductive strip is driven by the driving signal SD. For the convenience of the descriptions, hereinafter, a finger of a real touch is called as a first finger, while a finger of an negative touch is called a second finger.

Accordingly, as for the first touch zone P1, the amount of capacitive coupling formed includes: the amount of capacitive coupling Ctr1 between the first conductive strip Tx1 and the second conductive strip Rx1; the amount of capacitive coupling Cht1 between the first conductive strip Tx1 and the first finger H1; and the amount of capacitive coupling Chr1 between the second conductive strip Rx1 and the first finger H1. Similarly, as for the second touch zone P2, the amount of capacitive coupling formed includes: the amount of capacitive coupling Ctr2 between the first conductive strip Tx2 and the second conductive strip Rx2; the amount of capacitive coupling Cht2 between the first conductive strip Tx2 and the second finger H2; and the amount of capacitive coupling Chr2 between the second conductive strip Rx2 and the second finger H2.

Moreover, some capacitive coupling Chg also exists between the device and a human body to which the first finger H1 and the second finger H2 belong. This value is usually between 10 pF and 250 pF, and the signal that passes through it is Sg.

Therefore, when the driving signal SD is provided to one or more first conductive strip(s) Tx1, a signal or signal variation of the intersecting region of each second conductive strip and the first conductive strip Tx1 is represented or obtained by detecting the signal of each second conductive strip. Similarly, the driving signal SD can be provided to other first conductive strips to represent or obtain signals or signal variations of all the intersecting regions. For example, signals Sr1 and Sr2 are sensed on the second conductive strips Rx1 and Rx2, which represent the amounts of capacitive couplings on the intersecting regions. These are compared with the amounts of capacitive couplings on the same intersecting regions when they are not touched to obtain the amounts of variations. Thus, when an external conductive object (e.g. a finger) touches the device, touched locations can be represented by the amounts or amounts of variations of capacitive coupling on these intersecting regions. Although the first finger H1 and the second finger H2 are each capacitive coupled to a first conductive strip and a second conductive strip, but one with ordinary skill in the art can understand that each finger can be capacitive coupled to a plurality of conductive strips.

Signal Sr1 may not be the only path from which the driving signal SD flows out, but some portion of the driving signal SD may flow from the conductive strip to an external conductive object, for example, from the conductive strip to the first finger H1 by capacitive coupling, indicated by a signal S1. All or part of the signal S1 may flow to ground or system ground via the external conductive object by capacitive coupling as indicated by a signal Sg, and some part of the signal S1 may flow via another external conductive object by capacitive coupling as indicated by a signal S2, for example, to a second conductive strip as indicated by signal Sr2 and/or to a first conductive strip provided with the DC signal.

Thus, not only variation of capacitive coupling is detected on the intersecting region of the first conductive strip Tx1 and the second conductive strip Rx1, but also on the intersecting region of the first conductive strip Tx1 and the second conductive strip Rx2. Since in reality, there is no actual capacitive coupling on the intersecting region of the first conductive strip Tx1 and the second conductive strip Rx2, but the detected signal indicates a variation in capacitive coupling, an negative touch is thus established. Further, the signal flows from the first finger to the second finger, thus the signals detected by the second conductive strips Rx1 and Rx2 are opposite to each other. When the real-touch signal Sr1 detected on the second conductive strip Rx1 is regarded as a real touch signal, then the signal Sr2 detected on the second conductive strip Rx2 can be regarded as an negative-touch signal. If the two second conductive strips from the respective first touch zone P1 and the second touch zone P2 are in proximity or effectively the same strip, the signals of the real touch and the negative touch may cancel each other, possibly resulting in a situation in which the real-touch signal is too small to be detected. The more negative touches there are, the more prominent this situation is; sometimes, a real-touch signal is cancelled even to the extent that it becomes an negative-touch signal. It can be seen from the impedance/capacitance analysis, the capacitance of a circuit provided with a DC signal in the second touch zone P2 (since when the first conductive strip Tx1 is provided with the driving signal, the first conductive strip Tx2 is provided with a DC signal (e.g. grounded)) is Chg+Cht2, and the capacitance of the negative-touch signal with second conductive strip Rx2 is Chr2. Thus, the ratio of an negative touch to a real touch is GTR=(Chr2)/(Chg+Cht2). The smaller this ratio, the smaller the cancelling effect of the negative- and real-touch signals. Thus, in order to eliminate or reduce the effect of the negative-touch signal on the real-touch signal, the area of the circuit provided with the DC signal can be adjusted, such that when the second finger H2 approaches or contacts the second touch zone P2, most of the contact area is on the circuit provided with the DC signal (or the first conductive strip not being provided with the driving signal).

A solution to reduce the cancelling of the real- and negative-touch signals and hence the misjudgment of the real touch signal is to reduce the signal of the negative touch as much as possible. The most straightforward way is to increase the distance between the external conductive object and the second conductive strip, for example, the distance between the second finger H2 and the second conductive strip Rx2. In an example of the present invention, when the insulating surface layer is glass, the distance between the second finger H2 and the second conductive strip Rx2 is about 1.1 mm. This can effectively solve the problem of canceling effect of a single real-touch signal and a single negative-touch signal. However, when facing with the challenges of one real-touch signal cancelled by several negative-touch signals, the distance between the finger and the second conductive strip will have to be increased even further. The tolerance of the cancelling effect without making misjudgment is obviously limited by the distance between the finger and the second conductive strip. This distance is hardly smaller than 0.7 mm. Thus, the distance between the finger and the second conductive strip must increase in order to reduce the negative-touch signal. However, this does not meet the market needs for thinner capacitive touch screens.

It can be seen from the ratio of a negative touch to a real touch GTR=(Chr2)/(Chg+Cht2) that, in order to reduce the cancelling effect of the real- and negative-touch signals (hereinafter referred to as the negative-touch effect), the amount of capacitive coupling Chr2 between the second conductive strip and the finger must be reduced, and/or the amount of capacitive coupling between the finger and the circuit provided with the DC signal (Chg+Cht2) must be increased.

Accordingly, in an example of the present invention, a plurality of first conductive strips and a plurality of second conductive strips in one conductive strip pattern intersect with each other and are exposed. The area of the exposed first conductive strips is greater than that of the exposed second conductive strips. In another example of the present invention, in the case where capacitive coupling range of a valid touch made by an external conductive object is large enough for a location to be determined, the conductive strip pattern is such that the area of the exposed first conductive strip covered by or capacitively coupled to capacitive coupling range is greater than of the exposed second conductive strip covered by or capacitively coupled to capacitive coupling range. For example, the area exposed by the second conductive strip is smaller than half of the area exposed by the first conductive strip, and capacitive coupling range is larger than the area of each intersecting region. When the first and second conductive strips cover the entire or almost cover the entire active area of a capacitive touch screen, such conductive strip pattern allows the area of the exposed first conductive strip covered by or capacitively coupled to a capacitive coupling range of any valid touch across multiple intersecting regions to be greater than of the exposed second conductive strip covered by or capacitively coupled to capacitive coupling range.

The external conductive object causes a valid touch when the touch range is larger than a predetermined condition, wherein the valid touch results in a signal or signal variation sufficient for determining a location. The predetermined condition can be width (length), area, and the like. For example, the largest or smallest width (or area) of the touch range is greater than a predetermined value. Thus, in a SITO structure, the amount of capacitive coupling between the second finger H2 and the second conductive strip will be smaller than the amount of capacitive coupling between the second finger H2 and the DC signal.

In addition, in a DITO structure, the first conductive strips are on an upper layer, while the second conductive strips are on a lower layer. That is, the first conductive strips are on a layer that is closer to external conductive objects. Thus, if a touch range of any external conductive object on the capacitive touch screen is greater than a predetermined condition, thus forming a valid touch, and when the area of a first conductive strip covered by the touch range is greater than the area of a second conductive strip covered by the touch range, then the amount of capacitive coupling between the second finger H2 and the second conductive strip will be smaller than the amount of capacitive coupling between the second finger H2 and the circuit provided with the DC signal.

In the prior art, in the case where the amount of capacitive coupling between the second finger H2 and the second conductive strip is not ensured to be smaller than the amount of capacitive coupling between the second finger H2 and the circuit provided with the DC signal, the greater the number of second fingers H2, the more the signals flowing into the second conductive strips by capacitive coupling between the second fingers H2 and the second conductive strips.

Figure 2B:
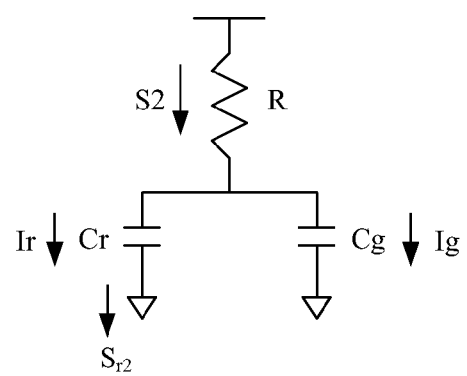
Figure 3A:
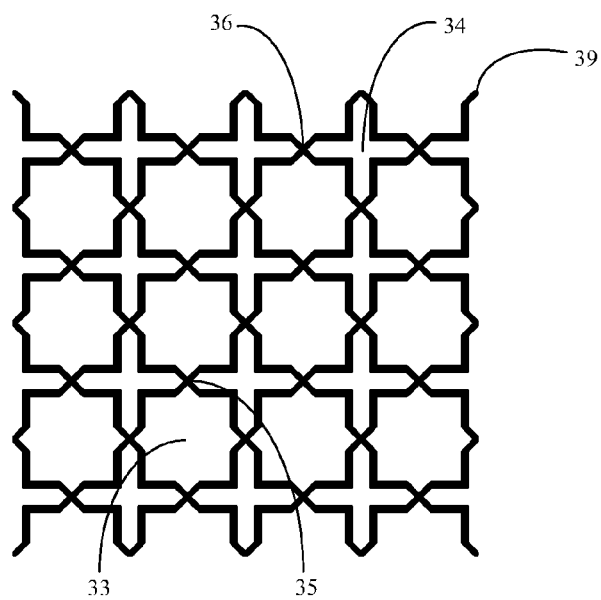
FIGS. 3A to 3D are schematic diagrams depicting the structure of a conductive strip pattern.
Figure 3B:
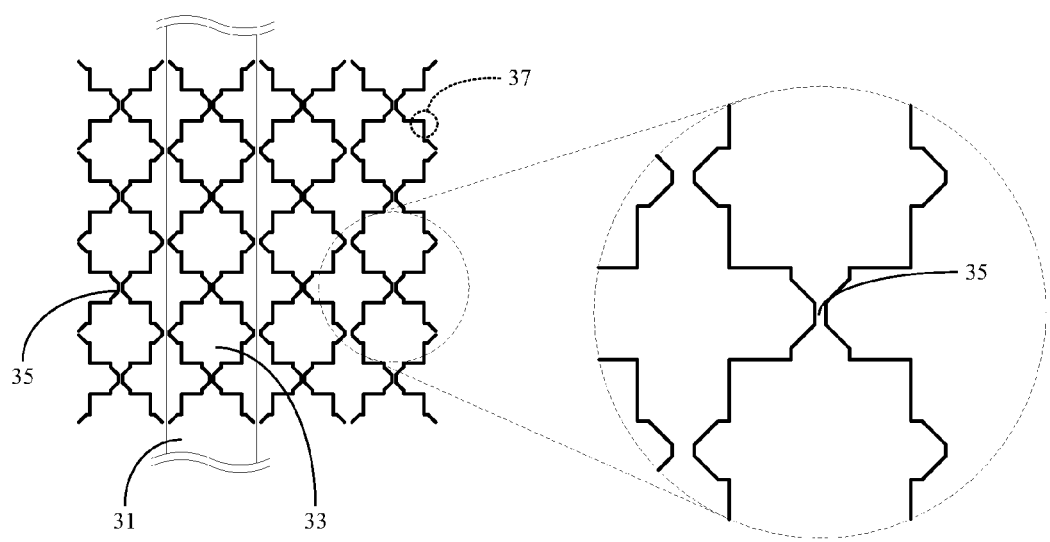
Figure 3C:
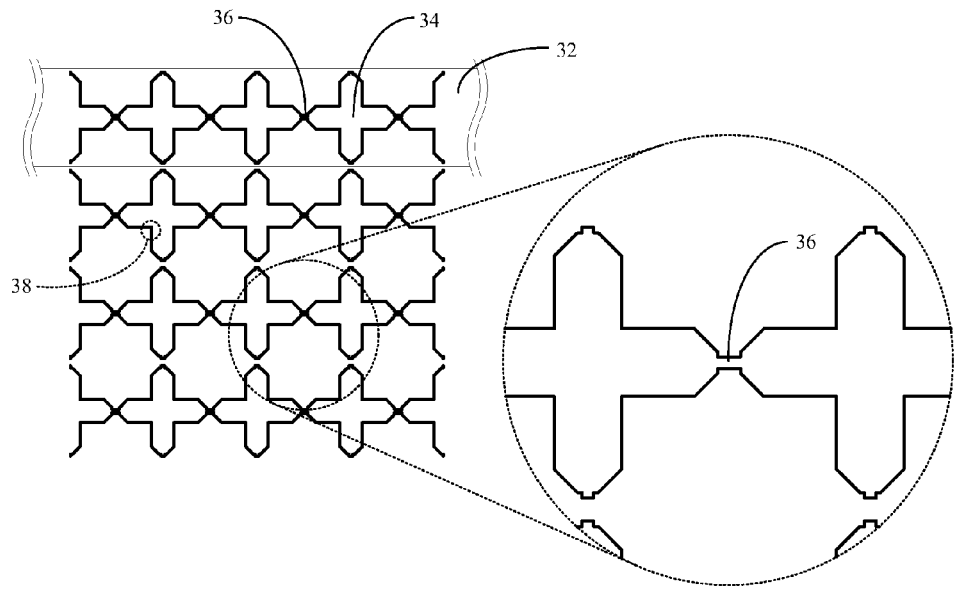
Figure 3D:
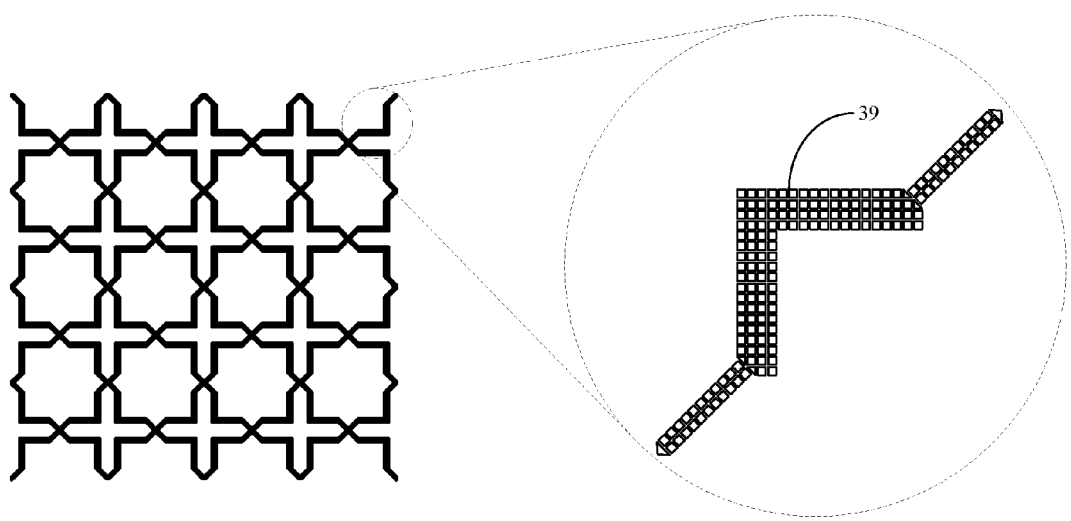

Referring to FIG. 2B, a schematic diagram illustrating an negative-touch signal S2 flowing into a conductive strip. The impedance R shown in the drawing indicates an impedance of the negative-touch signal S2 before flowing into the conductive strip. Since the signal of the driving signal capacitively coupled to the first finger H1 will flow through the second finger H2 and form a capacitive coupling Cr with the second conductive strip and a capacitive coupling Cg with the circuit provided with a DC signal (e.g. a first conductive strip not provided with the driving signal), a signal Ir flowing into the second conductive strip and a signal Ig flowing into the circuit provided with a DC signal are formed, respectively. Obviously, the driving signal after capacitive coupled to the first finger H1 flows into the second conductive strip and the circuit provided with a DC signal in parallel, when the number of second fingers H2 increases, the amounts of capacitive coupling Cr and Cg also increase. If the increase in capacitive coupling Cr is greater than the increase in capacitive coupling Cg, since the impedance is inversely proportional to the capacitance, the signal Ir will increase, and the signal Ig will decrease, that is, the negative-touch effect will increase.

Therefore, as the number of second fingers H2 causing negative touches increases, the distance between the second conductive strip and the second finger must also increase, for example, with a thicker insulating surface layer, so as to tolerate the negative-touch effect and avoid misjudgment of the locations of real touches. However, increasing the thickness of the insulating surface layer is against the objective of decreasing the thickness of the capacitive touch screen.

Accordingly, a technical mean for reducing the negative-touch effect according to an example of the present invention adopts a conductive strip pattern, assuming the touch range of a valid touch is larger than a predetermined condition, the conductive strip pattern is designed such that the area of an exposed first conductive strip covered by any touch range larger than the predetermined condition must be larger than the area of an exposed second conductive strip covered. Thus, when the number of second fingers H2 increases, the increase in capacitive coupling Cg is greater than the increase in capacitive coupling Cr, and since the impedance is inversely proportional to the capacitance, the signal Ig will increase, and the signal Ir will decrease, that is, the negative-touch effect will decrease.

In a best mode of the present invention, the first conductive strips are on an upper layer of a DITO structure, while the second conductive strips are on a lower layer of the DITO structure.

According to the above, an example of the present invention provides a mutual capacitive multi-touch screen. The conductive strip pattern allows that, when a touch range of each external conductive object on the mutual capacitive multi-touch screen is larger than a predetermined condition, capacitive coupling between each external conductive object and a first conductive strip is greater than capacitive coupling between each external conductive object and a second conductive strip, such that the proportion of a driving signal flowing out of the first conductive strip via at least one first external conductive object in the external conductive objects and into the second conductive strip via at least one second external conductive object in the external conductive objects decreases as the number of second external conductive objects increases.

In the present invention, assuming that the amount of signal flowing out of a conductive strip via capacitive coupling is the same, when the number of second fingers H2 increases, capacitive coupling between the second fingers H2 and the second conductive strips decreases. Under this condition, the thickness of the insulating surface layer only needs to able to tolerate the negative-touch effect of one second finger H2, which is to say that this thickness can tolerate the negative-touch effect arising from more second fingers H2. Tolerating the negative-touch effect means that when there are negative touches generated by one or more second fingers H2, the location of each real touch can be correctly determined.

According to the above, when a capacitive touch screen is not transparent, for example, a touch pad used as pointing device in a laptop computer, the negative-touch effect can be reduced by thinning the sensed conductive strips (e.g. the second conductive strips). However, if the sensed conductive strips are distributed too sparsely, then when a slant straight line is drawn, a series of coordinates representing the location of the finger may exhibit a slant line with a saw-tooth shape. The more sparse the arrangement of the second conductive strips is, the more prominent the saw tooth will be.

Moreover, when a capacitive touch screen is transparent (a touch sensitive display on a display, for example), in order to obtain a uniform transmittance, the conductive strips on the capacitive touch screen should be as uniformly distributed on the active area of the capacitive touch screen as possible, as shown in FIG. 1E, for example. The conductive pads are rhombic in the drawing, but one with ordinary skill in the art can recognize that the conductive pads can have a polygonal shape (e.g. a hexagonal or octagonal shape) or other geometric shape.

Referring to FIGS. 3A to 3D, a capacitive touch screen for detecting touches or approaches of external conductive objects according to an example of the present invention is provided. It includes a plurality of first conductive strips 31 and a plurality of second conductive strips 32.

The first conductive strips 31 are operatively provided with a driving signal during mutual-capacitive coupling detection, wherein each first conductive strip 31 is composed of a plurality of first connecting lines 35 connected in series with a plurality of first conductive pads 33, and each first conductive pad 33 extends out an extension pad 37 from each side of the square or rhombus. In a preferred example of the present invention, the extension pad 37 is in the shape of a triangle, and thus the first conductive pad 33 is a hexadecagon. One with ordinary skill in the art can appreciate that the extension pad 37 may be a rectangular, rhombus or other polygons.

The second conductive strips 32 provide mutual capacitive coupling signals, wherein each second conductive strip 32 is composed of a plurality of second connecting lines 36 connected in series with a plurality of second conductive pads 34, and a recess space 38 is provided on each side of the square or rhombus of each of the second conductive pads 34. One of the extension pads 37 is situated in each recess space 38. In a preferred example of the present invention, the recess space 38 is in the shape of a triangle, and thus the second conductive pad 34 is a hexadecagon. One with ordinary skill in the art can appreciate that the recess space 38 may be a rectangular, rhombus or other polygons.

In a best mode of the present invention, the first conductive pad 33 is a hexadecagon formed from a square or rhombus with outwardly-extending extension pads 37 and the second conductive pad 34 is a hexadecagon formed from a square or rhombus with indented recess spaces 38. There can be a plurality of isolated third conductive pads 39 (dummy pads) in the exposed space between the first conductive strips 31 and the second conductive strips 32. The third conductive pads 39 can be made of the same material as the first conductive strips 31. In addition, the third conductive pads 39 can be made of the same material as the second conductive strips 32.

In an example of the present invention, the area of each first conductive pad 33 after subtraction of the extension pads 37 equals to the area of each second conductive pad 34 after addition of the recess spaces 38, such that the exposed area of the first conductive pad 33 is larger than that of the second conductive pad 34. In another example of the present invention, the area of each first conductive pad 33 after subtraction of the extension pads 37 is less than the area of each second conductive pad 34 after addition of the recess spaces 38, such that the exposed area of the first conductive pad 33 is larger than that of the second conductive pad 34. In fact, the area difference between the area of each first conductive pad 33 after subtraction of the extension pads 37 and the area of each second conductive pad 34 after addition of the recess spaces 38 is approximately or equals to the area of the third conductive pad 39 surrounding the periphery of each second conductive pad 34.

Moreover, in an example of the present invention, the capacitive touch screen employs single ITO (SITO) structure. The first conductive pads 33 and the second conductive pads 34 are on the same plane. Each first connecting line 35 crosses over one of the second connecting lines 36 or each second connecting line 36 crosses over one of the first connecting lines 35, wherein the intersecting first connecting lines 35 and the second connecting lines 36 are separated by an insulating material (not shown).

In another example of the present invention, the capacitive touch screen employs double ITO (DITO) structure. The first conductive pads 33 and the second conductive pads 34 are not on the same plane, wherein the first conductive pads 33 are closer to external conductive objects than the second conductive pads 34.

In addition, in an example of the present invention, the first conductive pads 33 and the second conductive pads 34 above do not include those incomplete conductive pads at both ends of the first conductive strips 31 and the second conductive strips 32. There is a half of a first conductive pad at either side of the first conductive strip 31, which is a portion of the first conductive strip, and is connected to a first conductive pad 33 via a first connecting line 35. Similarly, there is a half of a second conductive pad at either side of the second conductive strip 31, which is connected to a second conductive pad 36 via a second connecting line 34.

In another example of the present invention, the capacitive touch screen can further include two first side conductive strips disposed on both sides of each first conductive strip and two second side conductive strips disposed on both sides of each second conductive strip, wherein each of the first side conductive strips is composed of a plurality of first connecting lines connected in series with a plurality of half of a first conductive pad, and each of the second side conductive strips is composed of a plurality of second connecting lines connected in series with a plurality of half of a second conductive pad.

The above driving signal can be an AC signal, such as a sinusoidal wave (e.g. a sine wave) or a square wave (e.g. a PWM wave).

Referring to FIG. 4, in a best mode of the present invention, a capacitive touch screen 40 is in the shape of a rectangle with two opposing long sides 42 and two opposing short sides 41, wherein the first conductive strips 31 are in parallel with the short sides 41, and the second conductive strips 32 are in parallel with the long sides 42. In other words, the capacitive touch screen 40 is in the shape of a rectangle with two opposing long sides 42 and two opposing short sides 41, wherein the first conductive strips 31 are arranged in parallel between the two short sides 41, and the second conductive strips 32 are arranged in parallel between the two long sides 42. In an example of the present invention, the number of the first conductive strips 31 is larger than the number of the second conductive strips 32. In other words, the number of the first conductive strips 31 provided with the driving signal is greater than the number of the second conductive strips 32 providing the mutual capacitive coupling signals.

As mentioned before, the mutual capacitive coupling signals provided by the second conductive strips 32 can be provided to the controller 160. The controller 160 can be an integrated circuit (IC). The controller 160 provides the driving signal, and the second conductive strips 32 receive the mutual capacitive coupling signals when at least one first conductive strip 31 is being provided with the driving signal. The present invention provides a device with a capacitive touch screen formed from the controller 160 and the capacitive touch screen mentioned before.

In an example of the present invention, if the mutual capacitive coupling signals are to be received simultaneously, there has to be the same number of elements for receiving these mutual capacitive coupling signals. Connecting to the second conductive strips 32 at the short sides is preferable than connecting to the first conductive strips 31 at the long sides, because less elements can be used to receive the mutual capacitive coupling signals for obtaining an image.

In another example of the present invention, the second conductive strips are sequentially arranged in parallel and there are N second conductive strips, wherein N is a natural number. The controller generates N−1 differential values based on the mutual capacitive coupling signals. Each differential value is obtained by subtracting between the mutual capacitive coupling signals of a pair of adjacent second conductive strips.

In another example of the present invention, the second conductive strips are sequentially arranged in parallel and there are N second conductive strips, wherein N is a natural number. The controller generates N−2 dual differential values based on the mutual capacitive coupling signals. Each dual differential value is obtained by subtracting between the difference between the mutual capacitive coupling signals of the first two second conductive strips among three adjacent second conductive strips and the difference between the mutual capacitive coupling signals of the last two second conductive strips among the three adjacent second conductive strips.

Since the noise interferences from the display on adjacent conductive strips are more or less the same, so the signal difference generated after simultaneously receiving two adjacent second conductive strips 32 can cancel out most of the noise interferences from the display. Therefore, there is no need to install a rear shielding layer in front of the capacitive touch screen. Normally, when the driving signal is provided, the rear shielding layer is provided with a DC potential or the driving signal in order to shield from the noise interference coming from the display.

According to the above, the present invention provides a detection method of a capacitive touch screen for detecting touches or approaches of external conductive objects as shown in FIG. 5. First, in step 510, a capacitive touch screen as mentioned before is provided, which is in the shape of a rectangle with two opposing long sides and two opposing short sides. The capacitive touch screen includes a plurality of first conductive strips and a plurality of second conductive strips. The first conductive strips are operatively provided with a driving signal during mutual capacitive coupling detection, wherein each first conductive strip is composed of a plurality of first connecting lines connected in series with a plurality of first conductive pads, and each first conductive strip is a square or a rhombus with an extension pad extending from each of the four sides, wherein the first conductive strips are in parallel with the short sides. The second conductive strips provide mutual capacitive coupling signals, wherein each second conductive strip is composed of a plurality of second connecting lines connected in series with a plurality of second conductive pads, and each second conductive strip is a square or a rhombus with an indented recess space on each of the four sides, wherein the second conductive strips are in parallel with the long sides. Next, in step 520, at least one first conductive strip is provided with the driving signal from one of the long sides, and the mutual capacitive coupling signals are received from the second conductive strips at one of the short sides when the at least one first conductive strip is being provided with the driving signal.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A detection method for a capacitive touch screen, comprising:
   providing a capacitive touch screen in the shape of a rectangle with two opposing long sides and two opposing short sides, the capacitive touch screen including:
      a plurality of first conductive strips being operatively provided with a driving signal during mutual capacitive coupling detection, wherein each first conductive strip is composed of a plurality of first connecting lines connected in series with a plurality of first conductive pads, and each first conductive strip is a square or a rhombus with an extension pad extending from each of the four sides, wherein the first conductive strips are in parallel with the short sides; and
      a plurality of second conductive strips providing mutual capacitive coupling signals, wherein each second conductive strip is composed of a plurality of second connecting lines connected in series with a plurality of second conductive pads, and each second conductive strip is a square or a rhombus with an indented recess space on each of the four sides, wherein the second conductive strips are in parallel with the long sides, wherein each first conductive pad is a hexadecagon formed from a square or rhombus with outwardly-extending triangular extension pads and each second conductive pad is a hexadecagon formed from a square or rhombus with indented triangular recess spaces; and
   providing at least one of the first conductive strips with the driving signal from one of the long sides, and receiving the mutual capacitive coupling signals from the second conductive strips at one of the short sides when the at least one first conductive strip is being provided with the driving signal.

2. A device including capacitive touch screen for detecting touches or approaches of external conductive objects, comprising:
   the capacitive touch screen including:
      a plurality of first conductive strips being operatively provided with a driving signal during mutual capacitive coupling detection, wherein each first conductive strip is composed of a plurality of first connecting lines connected in series with a plurality of first conductive pads, and each first conductive strip is a square or a rhombus with an extension pad extending from each of the four sides; and
      a plurality of second conductive strips providing mutual capacitive coupling signals, wherein each second conductive strip is composed of a plurality of second connecting lines connected in series with a plurality of second conductive pads, and each second conductive strip is a square or a rhombus with an indented recess space on each of the four sides, wherein each first conductive pad is a hexadecagon formed from a square or rhombus with outwardly-extending triangular extension pads and each second conductive pad is a hexadecagon formed from a square or rhombus with indented triangular recess spaces; and
   a controller providing the driving signal and receiving the mutual capacitive coupling signals from the second conductive strips when the at least one first conductive strip is being provided with the driving signal, wherein the first conductive strips and the second conductive strips are exposed and separated from each other, and one of the extension pads is situated in each recess space.

3. The device including capacitive touch screen of claim 2, wherein the area of each first conductive pad after subtraction of the extension pads equals to the area of each second conductive pad after addition of the recess spaces, such that the exposed area of the first conductive pad is larger than that of the second conductive pad.

4. The device including a capacitive touch screen of claim 2, wherein the first conductive pads and the second conductive pads are on the same plane.

5. The device including a capacitive touch screen of claim 2, wherein the number of the first conductive strips is larger than that of the second conductive strips.

6. The device including a capacitive touch screen of claim 2, wherein each of the first connecting lines crosses over one of the second connecting lines or each of the second connecting lines crosses over one of the first connecting lines, wherein the intersecting first connecting lines and the second connecting lines are separated by an insulating material.

7. The device including a capacitive touch screen of claim 2, wherein the first conductive pads and the second conductive pads are not on the same plane, wherein the first conductive strips are closer to the external conductive objects than the second conductive strips.

8. The device including a capacitive touch screen of claim 7, wherein the capacitive touch screen further includes an insulating layer between the first conductive strips and the second conductive strips.

9. The device including a capacitive touch screen of claim 2, further comprising a display, wherein there is no insulating layer with a constant potential or with the driving signal between the display and the second conductive pads, wherein the constant potential or the driving signal is provided when the second conductive strips are providing the mutual capacitive coupling signals.

10. The device including a capacitive touch screen of claim 2, wherein the first conductive pads and the second conductive pads are not on the same plane, wherein the second conductive strips are closer to the display than the first conductive strips.

11. The device including a capacitive touch screen of claim 2, wherein the capacitive touch screen is in the shape of a rectangle with two opposing long sides and two opposing short sides, wherein the first conductive strips are arranged in parallel between the two short sides, and the second conductive strips are arranged in parallel between the two long sides.

12. The device including a capacitive touch screen of claim 2, wherein the capacitive touch screen further includes two first side conductive strips disposed on both sides of each first conductive strip and two second side conductive strips disposed on both sides of each second conductive strip, wherein each of the first side conductive strips is composed of the plurality of first connecting lines which are connected all in series with a plurality of half of the first conductive pads, and each of the second side conductive strips is composed of the plurality of second connecting lines which are connected all in series with a plurality of half of the second conductive pads.

13. The device including a capacitive touch screen of claim 2, wherein the second conductive strips are sequentially arranged in parallel and there are N second conductive strips, where N is a natural number, wherein the controller generates N−1 differential values based on the mutual capacitive coupling signals, where each differential value is obtained by subtracting between the mutual capacitive coupling signals of a pair of adjacent second conductive strips.

14. The device including a capacitive touch screen of claim 2, wherein the second conductive strips are sequentially arranged in parallel and there are N second conductive strips, where N is a natural number, wherein the controller generates N−2 dual differential values based on the mutual capacitive coupling signals, where each dual differential value is obtained by subtracting between the difference between the mutual capacitive coupling signals of the first two second conductive strips among three adjacent second conductive strips and the difference between the mutual capacitive coupling signals of the last two second conductive strips among the three adjacent second conductive strips.

15. The device including a capacitive touch screen of claim 2, wherein there are a plurality of isolated third conductive pads in exposed space between the first conductive strips and the second conductive strips, and the conductive pads are made of the same material as the first conductive strips.

16. The device including a capacitive touch screen of claim 2, further comprising a display, and there is no rear shielding layer for shielding from noise interference of the display between the first conductive strips and the display.

17. A capacitive touch screen for detecting touches or approaches of external conductive objects, comprising:
   a plurality of first conductive strips being operatively provided with a driving signal during mutual capacitive coupling detection, wherein each first conductive strip is composed of a plurality of first connecting lines connected in series with a plurality of first conductive pads, and each first conductive strip is a square or a rhombus with an extension pad extending from each of the four sides; and
   a plurality of second conductive strips providing mutual capacitive coupling signals, wherein each second conductive strip is composed of a plurality of second connecting lines connected in series with a plurality of second conductive pads, and each second conductive strip is a square or a rhombus with an indented recess space on each of the four sides,
   wherein each first conductive pad is a hexadecagon formed from a square or rhombus with outwardly-extending triangular extension pads and each second conductive pad is a hexadecagon formed from a square or rhombus with indented triangular recess spaces,
   wherein the first conductive strips and the second conductive strips are exposed and separated from each other, and one of the extension pads is situated in each recess space.

18. The capacitive touch screen of claim 17, wherein the area of each first conductive pad after subtraction of the extension pads equals to the area of each second conductive pad after addition of the recess spaces, such that the exposed area of the first conductive pad is larger than that of the second conductive pad.

19. The capacitive touch screen of claim 17, wherein the first conductive pads and the second conductive pads are on the same plane.

20. The capacitive touch screen of claim 17, wherein the number of the first conductive strips is larger than that of the second conductive strips.

21. The capacitive touch screen of claim 17, wherein each of the first connecting lines crosses over one of the second connecting lines or each of the second connecting lines crosses over one of the first connecting lines, wherein the intersecting first connecting lines and the second connecting lines are separated by an insulating material.

22. The capacitive touch screen of claim 17, wherein the first conductive pads and the second conductive pads are not on the same plane, wherein the first conductive strips are closer to the external conductive objects than the second conductive strips.

23. The capacitive touch screen of claim 17, further comprising two first side conductive strips disposed on both sides of each first conductive strip and two second side conductive strips disposed on both sides of each second conductive strip, wherein each of the first side conductive strips is composed of the plurality of first connecting lines which are connected all in series with a plurality of half of the first conductive pads, and each of the second side conductive strips is composed of the plurality of second connecting lines which are connected all in series with a plurality of half of the second conductive pads.

* * * * *